(12) United States Patent
Miller (10) Patent No.: US 7,310,392 B2
(45) Date of Patent: Dec. 18, 2007

(54) METHOD AND APPARATUS FOR DETERMINING INTER-SYMBOL INTERFERENCE FOR ESTIMATING DATA DEPENDENT JITTER

(75) Inventor: Martin Miller, Avusy (CH)

(73) Assignee: LeCroy Corporation, Chestnut Ridge, NY (US)

( * ) Notice: Subject to any disclaimer, the term of this patent is extended or adjusted under 35 U.S.C. 154(b) by 743 days.

(21) Appl. No.: 10/688,661

(22) Filed: Oct. 17, 2003

(65) Prior Publication Data

US 2004/0136479 A1   Jul. 15, 2004

Related U.S. Application Data

(60) Provisional application No. 60/419,507, filed on Oct. 18, 2002.

(51) Int. Cl.
*H03D 1/06* (2006.01)
(52) U.S. Cl. .................................. 375/348; 455/296
(58) Field of Classification Search ................ 375/348; 703/14; 369/59; 455/296
See application file for complete search history.

(56) References Cited

U.S. PATENT DOCUMENTS 5,058,130 A * 10/1991 Park ........................... 375/230
5,128,964 A * 7/1992 Mallory ....................... 375/261
5,631,759 A   5/1997 Bogdan et al.
5,966,684 A * 10/1999 Richardson et al. ......... 702/191
6,278,357 B1   8/2001 Croushore et al.
6,366,631 B1 * 4/2002 Nakayama et al. ......... 375/371
6,546,345 B1   4/2003 Ghiasi
6,597,650 B2 * 7/2003 Katakura et al. ......... 369/59.22
7,002,890 B2 * 2/2006 Miyagawa et al. ...... 369/59.24
2002/0032555 A1 * 3/2002 Suwada et al. ............... 703/14

* cited by examiner

*Primary Examiner*—Mohammed Ghayour
*Assistant Examiner*—Juan Alberto Torres
(74) *Attorney, Agent, or Firm*—Frommer Lawrence & Haug LLP (57) ABSTRACT

A method and apparatus for displaying substantially noise-free segments of serial data waveforms. The method comprises the steps of dividing an acquired waveform into a plurality of waveform slices and categorizing each of the plurality of waveform slices according to at least a sequence of N bit values prior to a bit value being observed. The waveform slices in each category are then averaged resulting in an average pattern for each category. Each of the averaged patterns is then displayed on a display in an overlayed manner.

20 Claims, 7 Drawing Sheets

METHOD AND APPARATUS FOR DETERMINING INTER-SYMBOL INTERFERENCE FOR ESTIMATING DATA DEPENDENT JITTER

CROSS-REFERENCE TO RELATED APPLICATIONS

This application claims the benefit of U.S. Provisional Patent Application 60/419,507, filed Oct. 18, 2002, the entire contents of which are incorporated herein by reference.

FIELD OF THE INVENTION

The present invention relates to a method and apparatus for determining inter-symbol interference (ISI) through analysis of long-memory recordings of data communication signals sampled in a digital oscilloscope or waveform digitizer to obtain an estimate of data dependent jitter.

BACKGROUND OF THE INVENTION

In any data or communication signal, interference between symbols in the signal is a contributor to both vertical and horizontal signal variations. The basic effect is that the shape and timing of subsequent data-symbols is affected by (or has a memory of) the precise sequence of prior symbols. That is, in the particular application of the display of an eye diagram on an oscilloscope, the symbols immediately preceding an observed bit-interval affect an eye-diagram for the observed bit-interval for a random bit stream.

Therefore, it would be beneficial to account for such interference when processing data communication signals, and when viewing an eye diagram on an oscilloscope.

SUMMARY OF THE INVENTION

In accordance with the present invention, a method and apparatus are provided for isolating the individual contributions to ISI based upon an analysis of data acquired in a single acquisition or recording of a communications channel under observation. By isolating the contribution to timing errors due to this systematic or deterministic contributor, and recalculating the series of timing errors with such errors "removed", one obtains a closer representation of the jitter due to factors other than ISI.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Method and Apparatus for Determining ISI (Inter-Symbol Interference) from Long-memory Recordings of Data Communication Signals for Obtaining an Estimate of "Data Dependent Jitter"

The present invention may be referred to as a "sliced-pattern-averager," because it comprises a method and apparatus to assimilate from one large record of a data or communication channel, a series of signal averaged signals (or waveform shapes) each specific to a specific prior symbol-state pattern or sequence. Because the results of such a procedure are averages, and have been averaged with the timing associated with an ideal recovered receiving clock (i.e. clock extractor optionally incorporating a "golden PLL", or arbitrary PLL), they represent a substantially noise-free shape of the response of the channel for each specified pattern.

In accordance with this invention, the following results are unique to signal analysis utilizing this invention:

1. A specific ISI component of jitter, and of systematic vertical variations in the communications channel may be determined.
2. A diagram similar to an eye-diagram is produced and displayed, but the diagram is substantially free of random noise, because the displayed signals are "signal averaged" and so, non-systematic or random effects are dramatically suppressed.
3. A horizontal distribution of ISI perturbation to the jitter distribution may be determined, which can be used as a tool for the deconvolution of the jitter distribution for the purposes of isolating and identifying the magnitude and shape of both symbol dependent and non-symbol-dependent jitter.
4. A vertical distribution of ISI perturbations which can be used as a tool for the deconvolution of the vertical variation distribution may also be provided for the purposes of isolating and identifying the magnitude and shape of both symbol dependent and non-symbol-dependent vertical noise.

This method and apparatus depends on the extraction and use of a system "clock" in accordance with a first embodiment. However, in accordance with further embodiments the method and apparatus may obtain the desired results with or without a system clock, since the system clock can be extracted from the analysis of the recorded data, or directly obtained from a simultaneous recording of said system clock. The extraction of a system clock from the analysis of the recorded data is described in copending U.S. patent application Ser. No. 10/673,735 filed Sep. 29, 2003, entitled METHOD AND APPARATUS FOR ANALYZING SERIAL DATA STREAMS, the entire contents thereof being incorporated herein by reference.

The information contained in a digitally recorded signal of long duration is leveraged in accordance with the invention. First a signal is captured which contains many "symbols" or "bit-intervals" of a serial data communication channel. It is critical that the quality of the recording be as precise as, or more precise than, the phenomena to be observed inasmuch as the quality of the recording limits the characterization of jitter and vertical noise. In this case the vertical noise and time-base "jitter" must be of a high quality. That is, the recording channel must add a minimum amount of vertical noise and jitter to the data signal being tested.

As described in U.S. patent application Ser. No. 10/673,735 noted above, a long record is first analyzed for threshold crossings and if (as is usually the case) the signal under test is a data channel, instead of a clock, the crossings are associated with virtual clock edges.

In what would otherwise be a calculation of the Time Interval Error (TIE), one finds the dependent information of the exact extracted clock edge time, and from this information a small subset of the original waveform can be presented with the "correct" time associated with said virtual recovered (expected) clock. This procedure may imply a feedback to the expected virtual clock timing, and as such simulates the presence of a clock extraction circuit (or even a "golden-PLL" clock extraction . . . as per certain communications standards).

Figure 1:
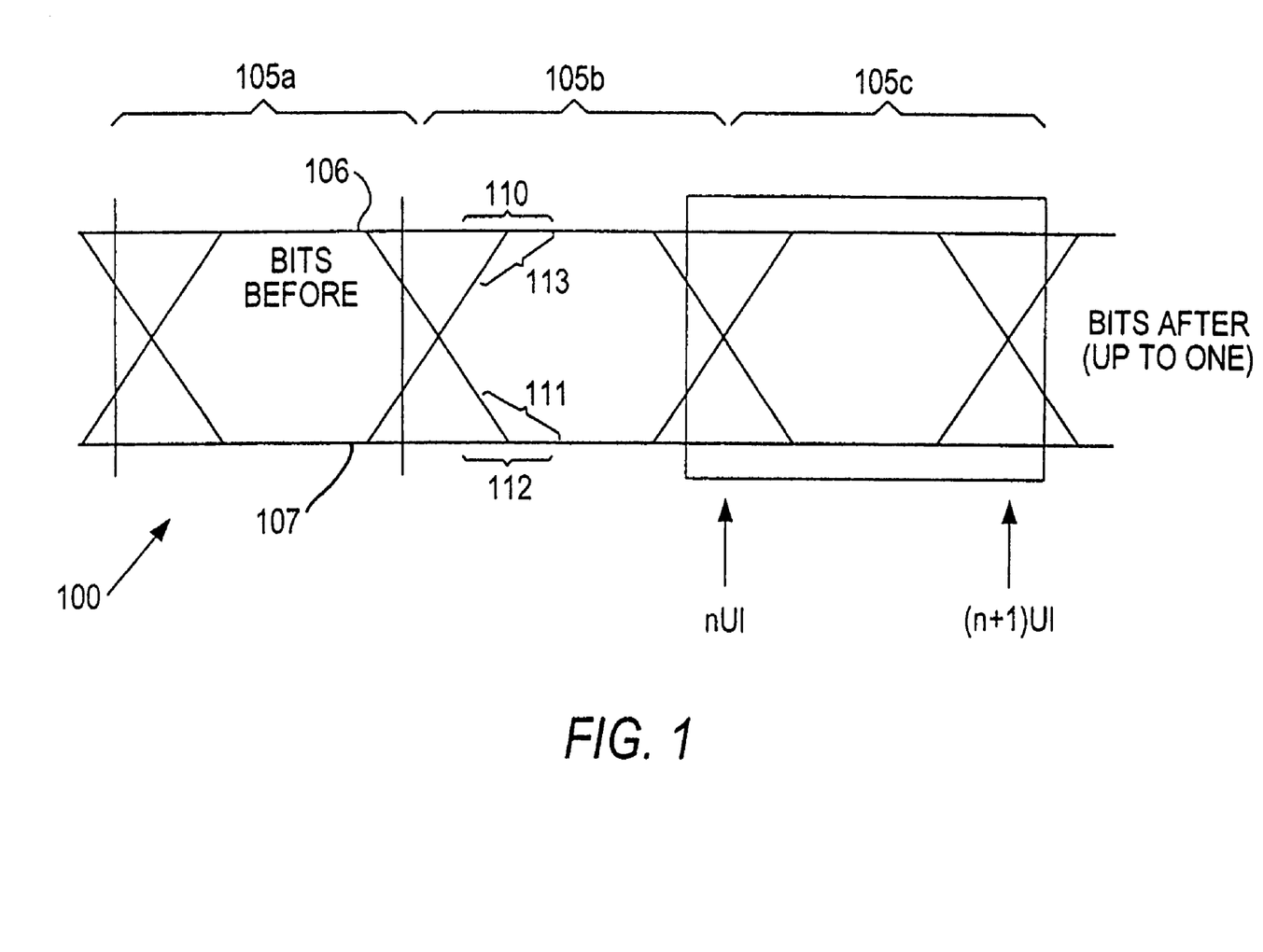
FIG. 1 is a representation of a recorded data signal.

Given the determination of the ideal clock times, portions of the recorded data are organized as shown in FIG. 1. As is shown in FIG. 1, a theoretical single data stream 100 comprises a plurality of bit intervals 105a 105b, 105c, . . . Data value lines 110, 111,112, 113 depict a possible state of a current bit interval 105a based upon a state of a prior bit interval. For example, in bit interval 105a, if a value near the end thereof is at location 106, for bit interval 105b, the value can either stay the same, thus following value 110, or can fall, thus following value 111. Alternatively, if the value at bit interval 105a is at location 107, for bit interval 105b, the value can either stay the same, thus following value 112, or can rise, thus following value 113.

Figure 2:
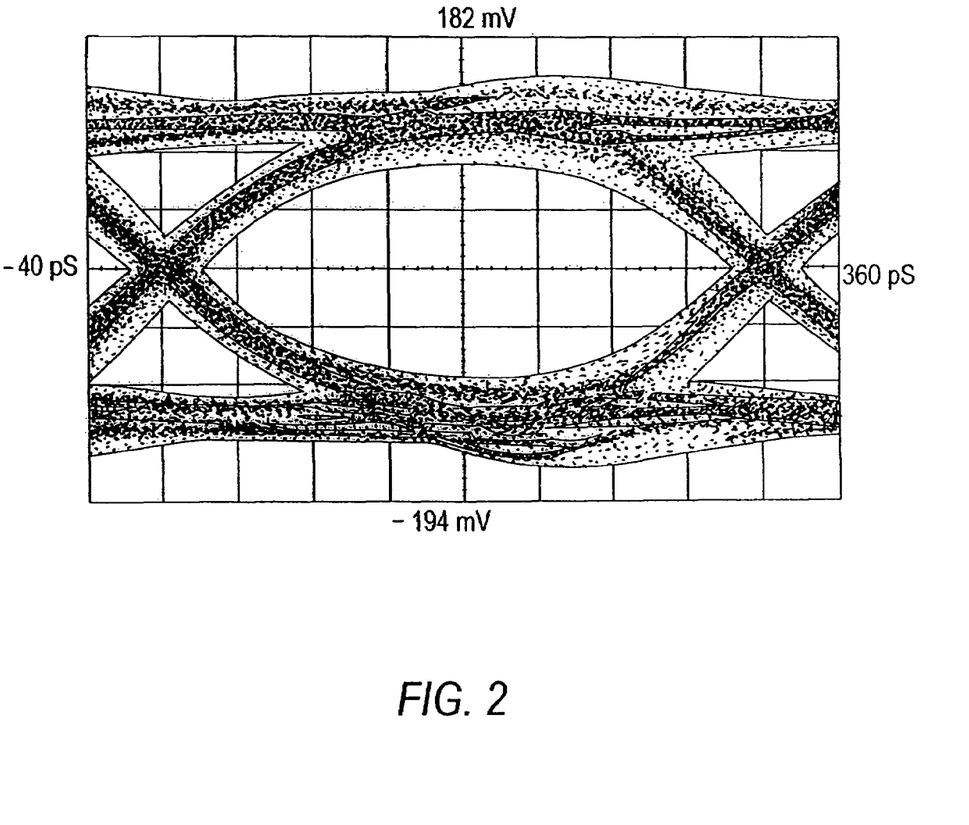
FIG. 2 is a screen shot of an eye-diagram.

When a plurality of bit intervals are overlaid on top of each other, because there are only a small number of possible paths for each bit interval, all of the possible paths are represented. Thus, the bit interval data extracted from a stored data signal and overlaid in a persistence display produce a display such as that shown in FIG. 2. FIG. 2 shows an example of an eye diagram produced from a single recorded signal OC-48 at 2.48832 Gigabits/second recorded with a LeCroy® Wave Master 8500 oscilloscope at 20 GS/s, and processed as per the method and apparatus of U.S. patent application Ser. No. 10/673,735 noted above.

Given these subset representations, the long-memory record containing many symbols duration or bit intervals, can be re-expressed as a multitude of smaller waveforms, each associated at an exact time associated with the system clock.

In accordance with the present invention, rather than combining all of these signals into a single persistence display as is shown in FIG. 2, the information is examined for N intervals prior to the observed bit interval, and also for the bit interval immediately following the bit-interval under observation. The signal is analyzed for the NRZ state at the center of each bit interval (between the virtual extracted system clock times) of the N prior intervals and one following bit to obtain the exact bit sequence of each small record (subset or "slice") of the waveform. Based upon the particular pattern of the M bits, each observed bit is placed in one of $2^M$ categories with all of the other observed "slices" having the same pattern of the M bits. When each observed slice is added to one of the $2^M$ categories, the average values associated with the precise pattern (M=N+1+1) bits is updated. Thus, the average values for each of the $2^M$ average categories will consist of an average of all the value bit intervals having the same values for the N prior and P following intervals, where N is preferably 6 (but may vary from 3 to 10, or to any other desired number of bits), P is preferably 1 (but may also be any other desired number). Note that the averaging procedure is effectively an up-sampling average or an average which has a higher effective sampling rate than the original recording. This simply means that there are more averaging buffers than one for each of the pattern averages, and that proper accounting needs be made for normalization of the final averaged result.

Figure 3:
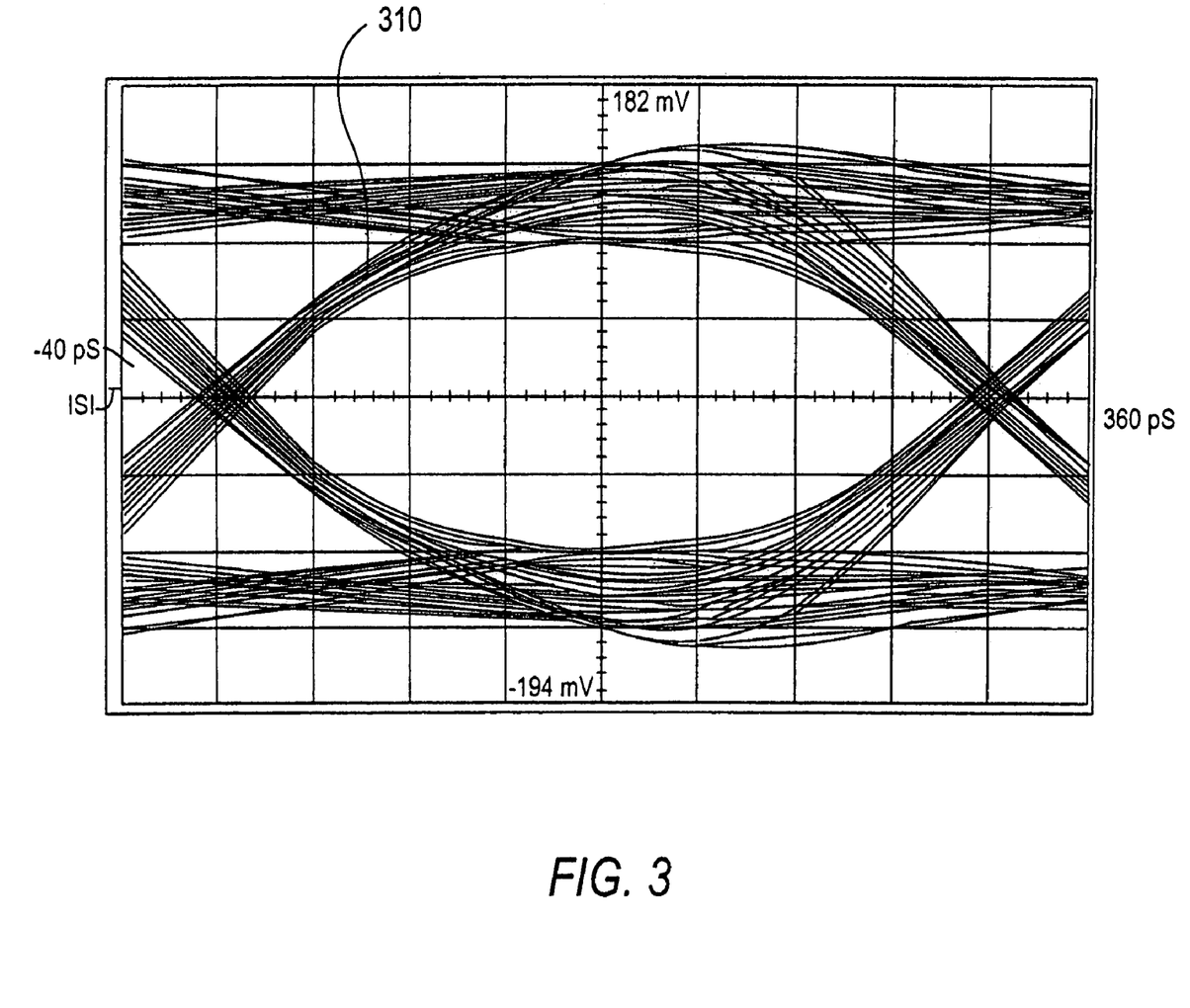
FIG. 3 is a screen shot depicting various average waveforms in accordance with the invention.

Upon completion of analyzing the entire long waveform recording, a single, average waveform will be provided for each of the $2^M$ categories. Each average waveform for each of the possible $2^M$ patterns, is then superimposed on a single bit interval display. It is not a necessary condition that all $2^M$ averages are complete. The overall display (scaled as for the persistence display previously shown) is shown in FIG. 3. Each average result is shown as a single line 310, for example, rather than the cloud of values shown in FIG. 2. Thus, this overlaid display is identical in scale to the eye-diagram which could have been formed by using all of the same information. However, the vertical and horizontal randomness, in as much as it is incoherent with the bit patterns (the $2^M$ sequences) is averaged "out" or substantially removed from the diagram. In FIG. 3, for the example case of M=5, each of the shapes your eye can "see" qualitatively are separated into 32 thin lines 310 ($2^5$=32). The horizontal cross-section (the set of times of crossing of the thin lines which cross a threshold between the $(M-1)^{th}$ and $M^{th}$ bit intervals) of this kind of display representation yields a precise horizontal distribution, which is the distribution of deterministic ISI jitter. Likewise vertical cross-section of the display will produce a fixed deterministic component for vertical variations.

This procedure and apparatus for implementing this procedure can supply a very rapid response (based upon a single large acquisition) compared to the response for analyzing many small acquisitions. Furthermore, the quality of the response is independent of the trigger stability of the recording instrument, but is instead dependent on the recording instrument's time-base (sampling interval) stability. In a practical implementation, the sampling interval stability is much easier to keep very small.

Figure 4:
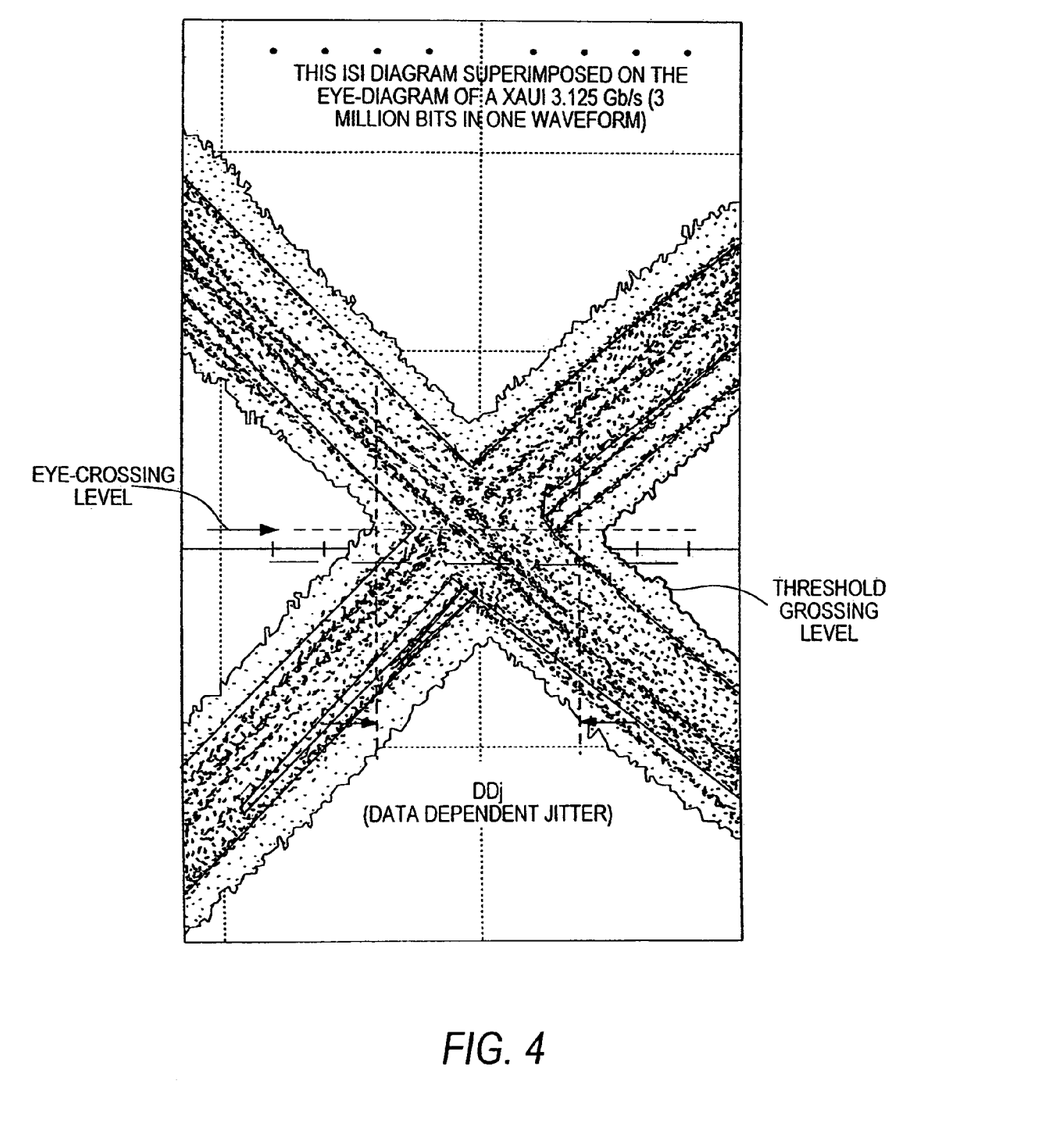
FIG. 4 is a close-up view of a crossing distribution of the screen shot of FIG. 3.

Further analysis of the resulting noise free shapes provides two important measures for the understanding of the communications channel. As shown in FIG. 4, these measures are obtained by performing a timing analysis on the distribution of the entire set of ($2^M$) waveforms, to obtain the level at which the crossing distribution's peak-to-peak (p-p) variation is narrowest (smallest in time), and the peak-to-peak variation for a specified vertical threshold pertinent to the communications signal specification. The former is called the "eye-crossing-level" and the latter the data dependent jitter, $DD_j$.

There are many significant benefits associated with the analysis available in accordance with this invention. The invention provides a new method and apparatus for obtaining ISI contributions to both vertical and horizontal signal variations (jitter and noise). Unlike other prior art methods that use a digital sampling-scope (in contrast to a single-shot or real-time digital oscilloscope) to measure noise free symbol responses by stimulating or controlling the data stream under test, this method does not require a specific controlled stimulus. Rather it sorts the information from any (either Pseudo-Random Binary Sequence (PRBS), constant pattern, truly random . . . or even "live") data streams. It has commercial value in that it determines ISI-based deterministic jitter and noise rapidly and free from statistical assumptions. This method provides a display which is insightful for understanding the nature of the variations in timing and vertical waveform characteristics which are otherwise hidden in noise. Another previously unexplored avenue is opened by such an analysis. By analyzing carefully the impulse response of the differential of two very special (100000 . . . and 011111 . . . ) pattern-averages, one can learn about the time-domain and frequency-domain nature of the ISI physical phenomenon.

Expressing Jitter without the ISI Contributions

Based upon the signal averager described above, the present invention performs a second "pass" on the results of a Time-Interval-Error (TIE) analysis of a data or communication channel. In this second pass, the prior bit history of the rising or falling edge of a bit interval in question is taken into account by reducing from the otherwise ordinary determination of TIE by compensating for the estimated systematic contribution due to this prior history. Thus, correction for any inherent error generated by values prior to or following a particular bit interval is made. The resulting sequence of values for TIE is a set of measurements having lower overall variation, since it has removed from it, the systematic contributions from ISI.

This distinction is important for several reasons:

1. Apart from statistical analysis encumbered by assumptions of coherence or incoherence, there is no other (common) way to remove the effect of ISI from jitter measurements (short of controlling the data sequence in a precise fashion as per prior-art).

2. Once ISI (or data dependent) contributions are removed from the jitter measurement, the remaining analysis is simplified; i.e. it is less "polluted" by competing phenomena.

3. In a practical sense, it is known that ISI is strongly coupled to the transmission medium (cable or optical fiber etc.) As such, having removed this component from the jitter measurement, the nature of the system without the effects of the transmission medium is revealed.

Thus, by leveraging a long-record recording of a data signal, Time Interval Error data is extracted, patterns in the data are identified and the distribution of systematic effects associated with said patterns is determined. From this information a re-analysis of the data provides signals that are noise-free, representing the behavior of the data channel in the absence of Inter Symbol Interference (ISI).

The information, which consists of the systematic contribution of ISI, is removed from the original measurement. As such, one may observe the histogram (approximation of the probability distribution function, or PDF) of the jitter or its behavior in frequency (i.e. submitting to a Fourier Analysis) without contributions from data dependent factors.

Figure 5:
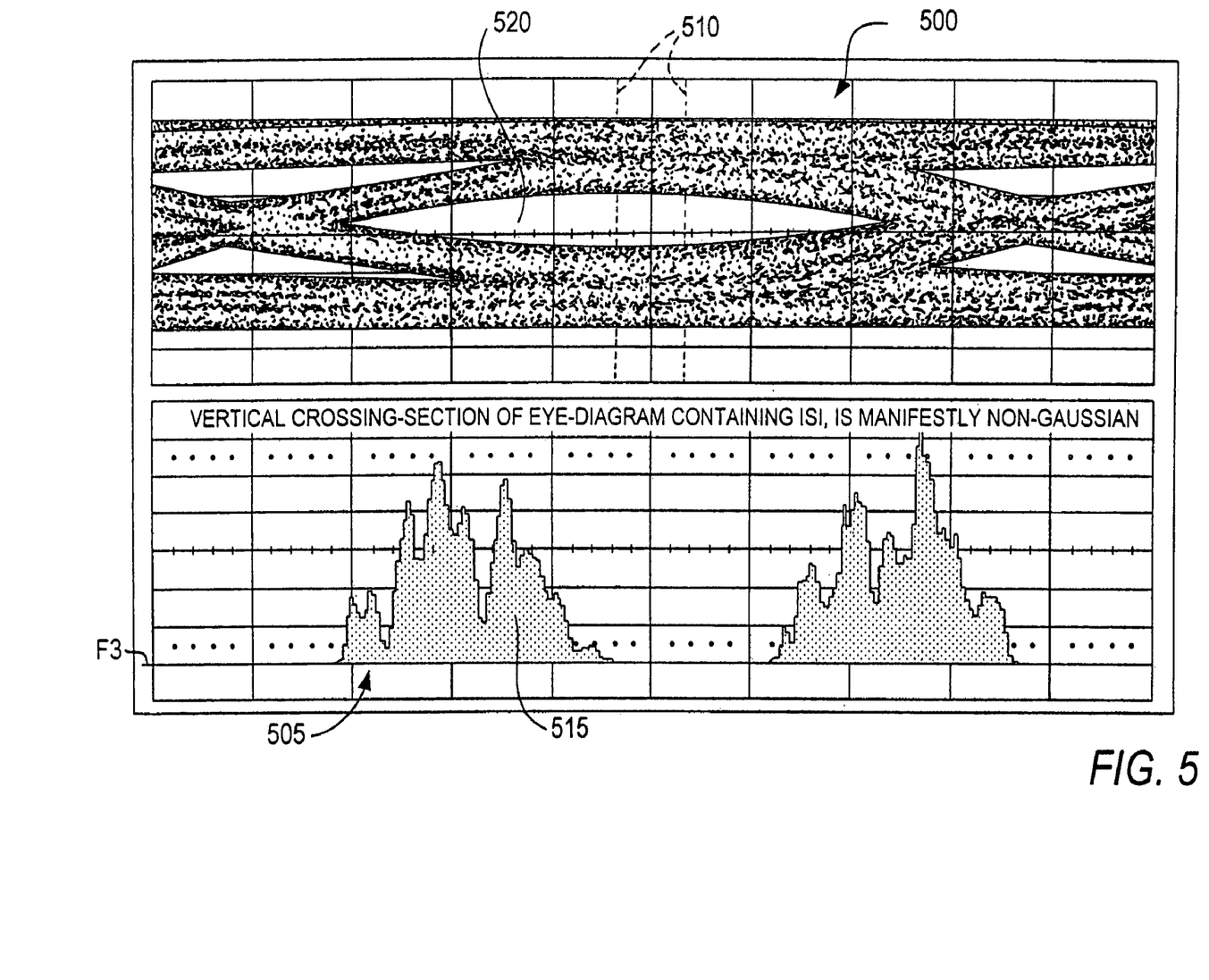
FIG. 5 is a representation of an eye-diagram and vertical sliced representation thereof.

Referring next to FIG. 5, an example applying the method and apparatus of the invention will now be shown. An eye-diagram 500 and a representation 505 of that eye-diagram taken along a plurality of vertical slices 510 (only two of which are labeled) of the eye-diagram are shown in FIG. 5. The representation of the vertical slices of the eye-diagram displays the distribution 515 of vertical variations in the signal taken along the horizontal center 520 of eye-diagram 500. Distribution 515 is manifestly non-Gaussian, but is composed of a many nearly Gaussian (random) distributions combined with the systematic vertical variations as can be characterized from analyzing the same vertical cross section of the ISI plot, as noted above.

Figure 6:
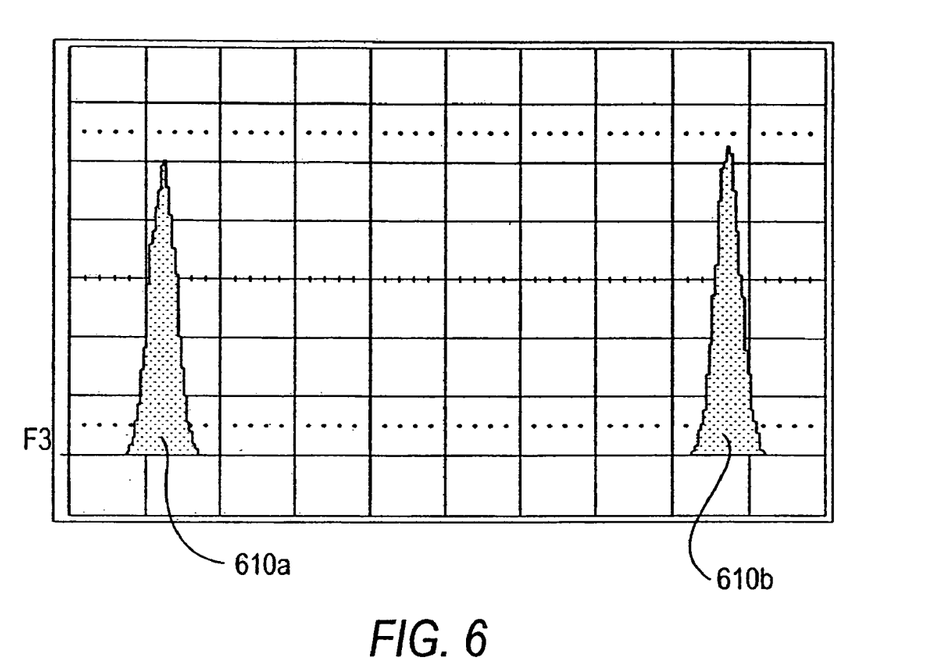
FIG. 6 is a vertical sliced representation of FIG. 5 after removing error attributable to ISI.

Once the error due to ISI is removed from the distribution of FIG. 5 in accordance with the invention by performing the averaging using the $2^M$ average values as noted above, a vertical distribution such as that shown in FIG. 6 may be achieved. As can be seen in FIG. 6, a pair of vertical noise distributions 610a, 610b is produced from a signal not manifesting ISI, and so not exhibiting a complex vertical noise distribution shape. Thus, any systematic error generated by the system (ISI) has been removed, and only non-ISI related effects remain. Other effects may include periodic interference, not related to the signal sequence or even bit rate. Once the ISI effects have been removed from the distribution of errors, the distribution may still be distorted. However, the remaining distribution will nonetheless be more correctly analyzed by traditional methods (e.g. Q-factor for prediction of BER).

Figure 7:
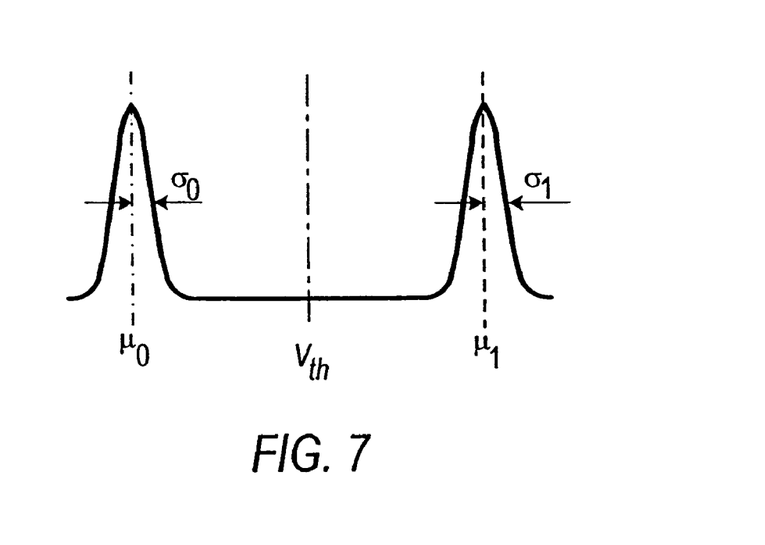
FIG. 7 is a graphical representation of the distribution of FIG. 6.

FIG. 7 depicts a graphical representation of the two Gaussian distributions of FIG. 6. This is the type of vertical noise distribution upon which a simplified conception of a "Q-factor" in accordance with the invention is based. From this determined Q-factor, a simple estimate of bit error rate due to vertical noise is determined. The Q-factor (or signal to noise ratio) is given by:

$$Q = \frac{\mu_1 - \mu_0}{\sigma_1 + \sigma_0}$$

If it is assumed that the behavior of each of the distributions is Gaussian, an estimate for the Bit Error Rate (BER) due to vertical noise can be obtained, which is expressed in terms of the decision threshold, $V_{th}$ (i.e. for hardware reception is the threshold voltage for which 1's and 0's are determined, such that: $V(t) > V_{th}$ is detected as a binary 1 and $V(t) < V_{th}$ as a binary 0).

$$BER(V_{th}) = \frac{1}{4}\left(\text{erfc}\left(\frac{\mu_1 - V_{th}}{\sqrt{2}\,\sigma_1}\right) + \text{erfc}\left(\frac{V_{th} - \mu_0}{\sqrt{2}\,\sigma_0}\right)\right)$$

where "erfc(x)" is the "complimentary error-function" given by:

$$erfc(x) = 1 - erf(x)$$

and where erf is a standard error function as is well known to one of ordinary skill in the art. This estimation is strongly based on the assumption that the variations from the two means $\mu_1$ and $\mu_0$, behave as Gaussian distributions. The benefit of this estimation associated with this invention is that each of the contributors to the complex vertical noise distribution can be isolated by forming a persistence map for each of the $2^M$ patterns, and the vertical slice for each of these, producing $2^M$ histograms. These individual histograms each will have a $\mu_n$ and $\sigma_n$ and a relative probability compared to all patterns present in the data-stream. From these a much more useful and correct estimation of BER $(V_{th})$ can be determined.

Figure 8:
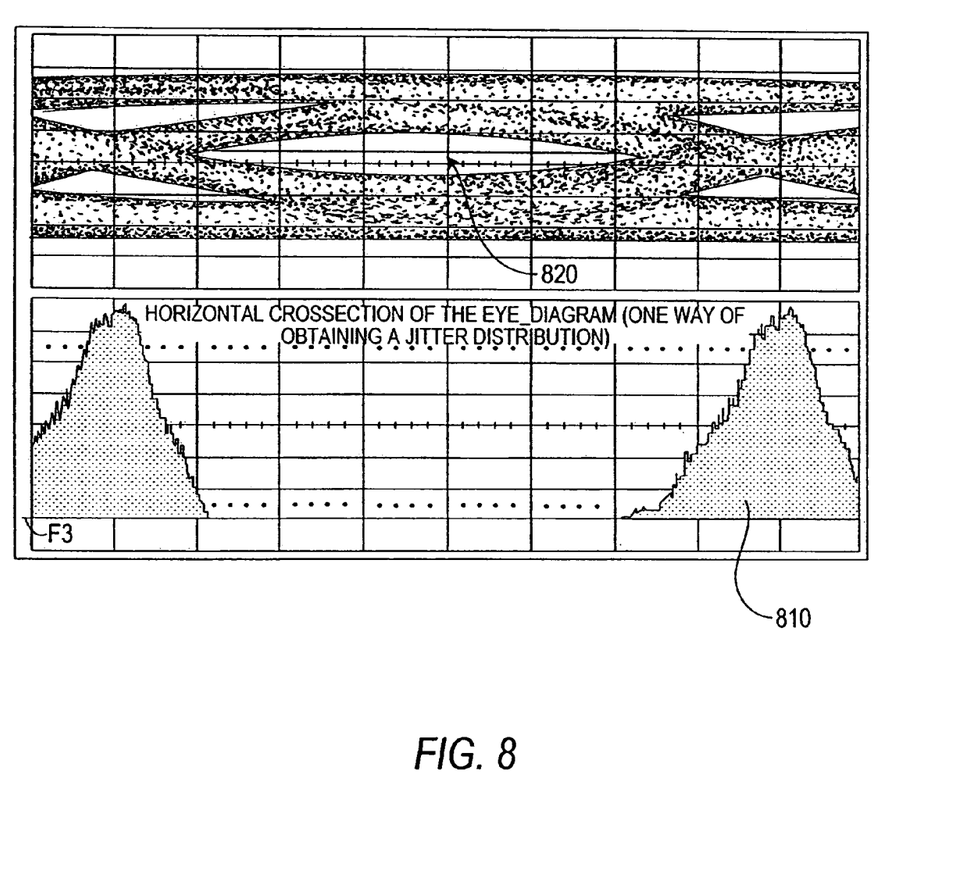
FIG. 8 is a horizontal cross section of the eye-diagram of FIG. 5.

A very similar discussion concerns the bit error rate at the sampling time $BER(T_{sampling})$ and how this is estimated from the horizontal or timing distributions. There are various methods in the industry today which attempt (with varying degrees of success) to parameterize the behavior of the horizontal noise or jitter into random and deterministic components (e.g. Rj and Dj) in order to estimate the overall confidence intervals for a given BER, as a function of the sampling time ($T_{sampling}$) across a bit interval. Such a graph of BER versus sampling time is called a "bathtub curve", where the vertical axis is BER and the horizontal axis is $T_{sampling}$, and is completely analogous to the BER as a function of $V_{th}$ for the vertical case. Such a distribution is shown in FIG. 8, where a horizontal cross section 810 of the eye-diagram is taken along horizontal line 820. As is shown, this method similarly produces non-Gaussian distributions, and is therefore subject to similar random and systematic errors that cannot easily be dissected. Such a complex timing error distribution is commonly found for timing distributions measured for signals containing significant ISI. Application of the present invention to to such a distribution would provide a better result as described above.

The benefit of this invention is that the complex distribution of timing variations can be reduced into a set of horizontal distributions particular to each of the $2^M$ patterns (representing the various possible combinations of M bits before and after the bit being considered), and a more precise estimation of BER can be obtained by analyzing these many but simpler distributions, than can be obtained by naively trying to estimate the BER (or total jitter as a function of BER) as a function of sampling time, by analyzing the single complex or composite distribution.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for displaying waveforms, comprising the steps of:
   dividing an acquired waveform into a plurality of waveform slices;
   categorizing each of said plurality of waveform slices according to at least a sequence of N bit values prior to a bit value being observed;
   averaging said waveform slices in each category resulting in an average pattern for each category;
   storing the average pattern for each category to a computer readable medium; and
   displaying each of said averaged patterns in an overlayed manner.

2. The method of claim 1, wherein N is in the range of 3-10.

3. The method of claim 2, wherein N=6.

4. The method of claim 1, wherein each of said waveforms is categorized further according to at least a sequence of P bit values following said bit value being observed.

5. The method of claim 4 wherein P=1.

6. The method of claim 1, wherein said acquired waveform is stored in a memory upon acquisition.

7. The method of claim 1, further comprising the step of obtaining data dependent jitter based upon a peak-to-peak variation of threshold crossing time for a specified vertical threshold.

8. The method of claim 1, further comprising the step of characterizing an eye crossing level by observing a level at which a crossing distribution's peak-to-peak variation is narrowest.

9. The method of claim 7, further comprising the step of re-dividing said acquired waveform into a second plurality of waveform slices in accordance with said obtained data dependent jitter, and substantially corrected for systematic intersymbol interference (ISI) induced jitter and/or noise.

10. The method of claim 9, wherein said second plurality of waveform slices depict a substantially ISI-free jitter component associated with said acquired waveform.

11. An apparatus for displaying waveforms, comprising:
    means for dividing an acquired waveform into a plurality of waveform slices;
    means for categorizing each of said plurality of waveform slices according to at least a sequence of N bit values prior to a bit value being observed;
    means for averaging said waveform slices in each category resulting in an average pattern for each category; and
    a display for displaying each of said averaged patterns in an overlayed manner.

12. The apparatus of claim 11, wherein N is in the range of 3-10.

13. The apparatus of claim 12, wherein N=6.

14. The apparatus of claim 11, wherein each of said waveforms is categorized further according to at least a sequence of P bit values following said bit value being observed.

15. The apparatus of claim 14, wherein P=1.

16. The apparatus of claim 11, wherein said acquired waveform is stored in memory upon acquisition.

17. The apparatus of claim 11, further comprising means for obtaining a data dependent jitter based upon a peak-to-peak variation of threshold crossing time for a specified vertical threshold.

18. The apparatus of claim 11, further comprising means for characterizing an eye crossing level by observing a level at which a crossing distribution's peak-to-peak variation is narrowest.

19. The apparatus of claim 17, further comprising means for re-dividing said acquired waveform into a second plurality of waveform slices at least additionally in accordance with said obtained data dependent jitter, and substantially corrected for systematic intersymbol interference (ISI) induced jitter and/or noise.

20. The apparatus of claim 19, wherein said second plurality of waveform slices depict a substantially ISI-free jitter component associated with said acquired waveform.

* * * * *